United States Patent [19]
Arimoto et al.

[11] Patent Number: 5,210,767
[45] Date of Patent: May 11, 1993

[54] SEMICONDUCTOR LASER

[75] Inventors: Satoshi Arimoto; Naohito Yoshida, both of Itami, Japan

[73] Assignee: Mitsubishi Denki Kabushiki Kaisha, Tokyo, Japan

[21] Appl. No.: 757,808

[22] Filed: Sep. 11, 1991

[30] Foreign Application Priority Data

Sep. 20, 1990 [JP] Japan ................................ 2-252708
Oct. 5, 1990 [JP] Japan ................................ 2-268822

[51] Int. Cl.$^5$ .............................................. H01S 3/19
[52] U.S. Cl. ...................................... 372/46; 372/45
[58] Field of Search ................................. 372/45, 46

[56] References Cited

FOREIGN PATENT DOCUMENTS

| 0209387 | 1/1987 | European Pat. Off. . |
| 0358227 | 3/1990 | European Pat. Off. . |
| 0384756 | 8/1990 | European Pat. Off. . |
| 64-90584 | 4/1989 | Japan . |
| 1-134985 | 5/1989 | Japan . |
| 1-238085 | 9/1989 | Japan . |
| 1-286486 | 11/1989 | Japan . |
| 1-300582 | 12/1989 | Japan . |
| 2-43791 | 2/1990 | Japan . |
| 2-45993 | 2/1990 | Japan . |
| 2-63183 | 3/1990 | Japan . |
| 2-82678 | 3/1990 | Japan . |

OTHER PUBLICATIONS

Fujii et al., "High-Power Operation of a Transverse-Mode Stabilised AlGaInP Visible Light ($\lambda_L$=683nm) Semiconductor Laser", Electronics Letters, vol. 23, No. 18, Aug. 1987, pp. 938-939.

Primary Examiner—Georgia Y. Epps
Attorney, Agent, or Firm—Leydig, Voit & Mayer

[57] ABSTRACT

A semiconductor laser includes a first conductivity type semiconductor substrate; a first conductivity type semiconductor first cladding layer disposed on the substrate; a semiconductor active layer disposed on the first cladding layer; a second conductivity type semiconductor second cladding layer disposed on the active layer; a current concentration and collection structure for confining current flow to part of the active layer including a second conductivity type ridge structure disposed on the second cladding layer, a first conductivity type semiconductor current blocking layer disposed directly on the second cladding layer and adjacent to and contacting the ridge structure, the ridge structure including a semiconductor etch stopping layer different in composition from and disposed on the second cladding layer and a second conductivity type semiconductor third cladding layer disposed on and different in composition from the etch stopping layer, and a second conductivity type semiconductor transition layer; a second conductivity type semiconductor contacting layer contacting the current concentration and collection structure; and first and second electrodes respectively disposed on the substrate and the contacting layer.

11 Claims, 9 Drawing Sheets

(PRIOR ART)

(PRIOR ART)

(PRIOR ART)

SEMICONDUCTOR LASER

FIELD OF THE INVENTION

The present invention relates to a semiconductor laser including an etch stopping layer and a method of producing the semiconductor laser.

BACKGROUND OF THE INVENTION

Figure 6:
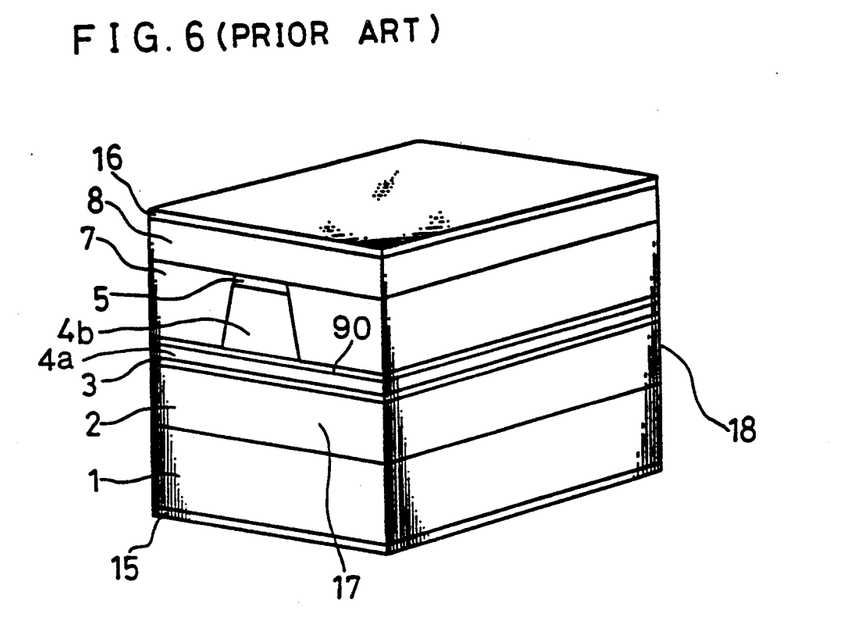
FIG. 6 is a perspective view of a semiconductor laser in accordance with the prior art.

FIG. 6 is a perspective view of a semiconductor laser structure disclosed by Fujii et al that employs layers of aluminum gallium indium phosphide (AlGaInP). The laser structure includes an n-type $(Al_{0.7}Ga_{0.3})_{0.5}In_{0.5}P$ first cladding layer 2, a gallium indium phosphide $(Ga_{0.5}In_{0.5}P)$ active layer 3, a p-type $(Al_{0.7}Ga_{0.3})_{0.5}In_{0.5}P$ second cladding layer 4a, and a p-type $Ga_{0.5}In_{0.5}P$ second cladding layer all successively disposed on and having the same width as an n-type gallium arsenide (GaAs) substrate 1. A stripe-shaped ridge structure 10 including a p-type $(Al_{0.7}Ga_{0.3})_{0.5}In_{0.5}P$ third cladding layer 4b is disposed on part of the etch stopping layer 90. A p-type GaAs transition layer 5 is part of the ridge structure and is disposed on the third cladding layer 4b. An n-type GaAs current blocking layer 7 is disposed on the etch stopping layer 90 where the ridge structure 10 is not present, i.e., on both sides of and contacting the ridge structure. A p-type GaAs contacting layer 8 is disposed on the ridge structure 10 in contact with the transition layer 5 and on the current blocking layer 7 at both sides of the ridge structure. Electrodes 15 and 16 are disposed on the substrate 1 and the contacting layer 8, respectively. The laser includes opposed facets 17 and 18 at opposite ends of the ridge structure, transverse to the thicknesses of the layers, preferably formed by cleaving.

A method of making the semiconductor laser structure of FIG. 6 is illustrated in FIGS. 7(a)-7(d). Initially, there are successively grown on the n-type GaAs substrate 1 the n-type $(Al_{0.7}Ga_{0.3})_{0.5}In_{0.5}P$ first cladding layer 2 to a thickness of about one micron, the $Ga_{0.5}In_{0.5}P$ active layer 3 to a thickness of about 0.1 micron, the p-type $(Al_{0.7}Ga_{0.3})_{0.5}In_{0.5}P$ second cladding layer 4a to a thickness of about 0.3 micron, the p-type $Ga_{0.5}In_{0.5}P$ etch stopping layer 90 to a thickness of about four to ten nanometers (nm), the p-type $(Al_{0.7}Ga_{0.3})_{0.5}In_{0.5}P$ third cladding layer 4b to a thickness of about 0.7 micron, and the p-type GaAs layer 5 to a thickness of about 0.2 micron. Preferably, these layers are grown by metal organic chemical vapor deposition (MOCVD) on a substrate with a (100) surface orientation.

Figure 7A:
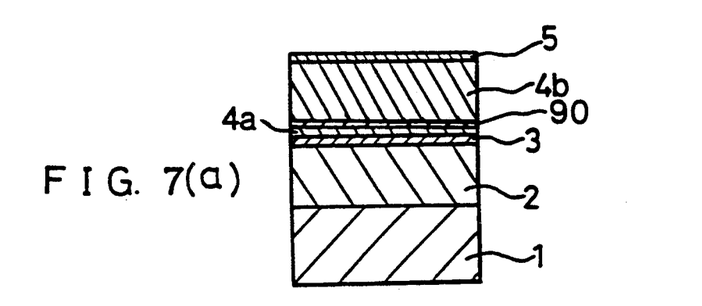
FIGS. 7(a)-7(d) illustrate a method of making the prior art semiconductor laser of FIG. 6.
Figure 7B:
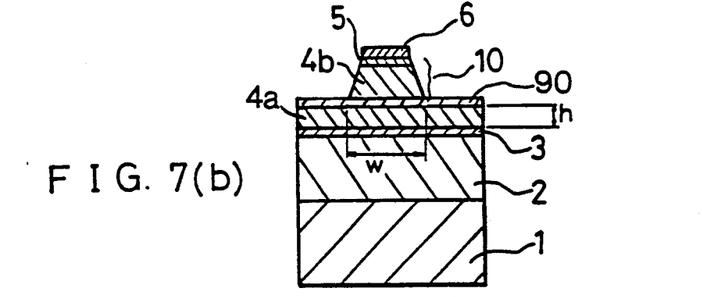

As illustrated in FIG. 7(b), a dielectric film, such as SiN or $SiO_2$, is deposited on the transition layer 5 and patterned to form a mask 6 over a central portion of the successively deposited layers. A ridge structure having a forward mesa shape, i.e., having a trapezoidal cross-section in the plane of the facets 17 and 18 with sides transverse to the active layer 3 that diverge in the direction of the active layer, is formed by wet etching of the transition layer 5 and the second cladding layer 4a. An etchant that attacks AlGaInP much more rapidly than it attacks GaInP is employed. The etching is effectively controlled, i.e., limited, in the direction of the second cladding layer 4a by the etch stopping layer 90, as shown in FIG. 7(b). Typically, the maximum width w of the ridge structure, i e , the dimension measured in FIG. 7(b) parallel to the active layer 3 and adjacent the etch stopping layer 90, is three to five microns.

Figure 7C:
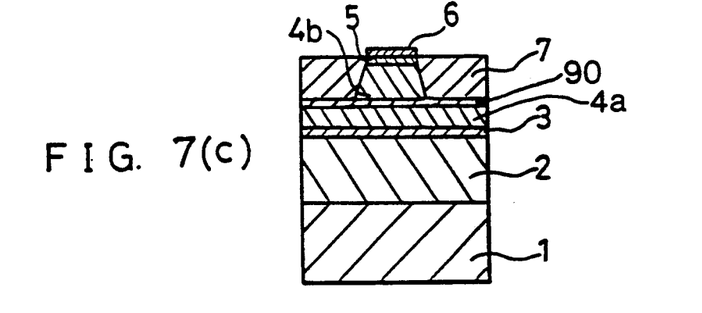

Subsequently, as illustrated in FIG. 7(c), the GaAs current blocking layer 7 is grown, preferably by MOCVD. When MOCVD is used, the current blocking layer 7 does not grow on the mask 6. After removal of the mask 6, in a third and final epitaxial growth step, the contacting layer 8 is grown on the current blocking layer 7 and the transition layer 5. The structure of FIG. 6 is completed by adding the electrodes 15 and 16 and cleaving to form the facets 17 and 18.

When a forward bias voltage is applied across the electrodes 15 and 16, a current flows between the electrodes and is concentrated in a central portion of the active layer 3 by the ridge structure 10, comprising the third cladding layer 4b, and by the current blocking layer 7 and collected through the ridge structure 10 and the contacting layer 8. When a threshold current flow is exceeded, the light generated by recombination of charge carriers in the active layer resonates in the ridge structure between the facets 17 and 18 and laser oscillation occurs. The wavelength of the light produced by the laser depends upon the energy band gap of the material employed in the active layer. When various alloys of GaInP and AlGaAs are used as the active layer material, visible light may be produced.

In addition to the materials just described with respect to the laser structure shown in FIGS. 6 and 7(a)-7(d), other materials can be employed in the laser and result in the generation of visible light. For example, instead of the AlGaInP cladding layers, the first, second, and third cladding layers 2, 4a, and 4b may be $Al_{0.45}Ga_{0.55}As$ and the active layer 3 may be $Al_{0.07}Ga_{0.93}As$. In this embodiment, the etch stopping layer 90 may be present or absent. The thicknesses of corresponding layers and the orientation of the substrate are substantially the same as those previously described with respect to the same structure employing different materials. The processing described with respect to FIGS. 7(a)-7(d) is the same as with the other materials including the use of a sulfate etchant, for example, sulfuric acid, for etching a ridge structure that lies along the $<0\overline{1}\overline{1}>$ direction without significantly attacking the etch stopping layer 90, if present. In these structures, referring to FIG. 7(b), the thickness h of the second cladding layer beyond the ridge structure is about 0.2 to 0.3 micron. When the etch stopping layer 90 is absent, the second and third cladding layers 4a and 4b are continuous and are continuously formed in a single growth step. In that case, the etching of the mesa must be more carefully controlled than when the etch stopping layer 90 is present to ensure that the thickness h of the second cladding layer or of a merged second and third cladding layer has the desired value. The operation of the laser employing different materials is identical to that of the initially described laser although the light emission may occur at a different wavelength.

Figure 8:
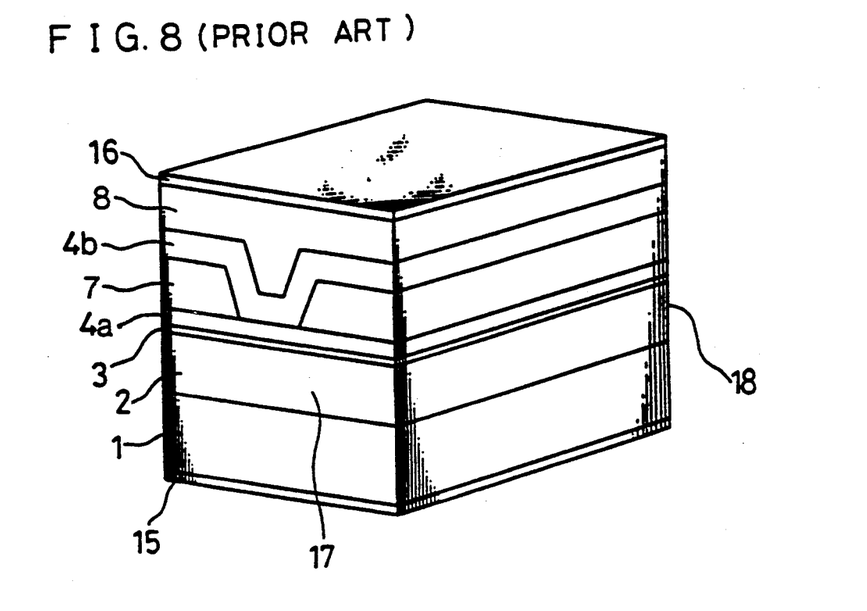
FIG. 8 is a perspective view of a semiconductor laser in accordance with the prior art.

A prior art groove-type or self-aligned semiconductor (SAS) laser structure according to the prior art is shown in FIG. 8. In that figure and in all other figures, the same elements are given the same reference numbers. The principal difference between the SAS laser structure of FIG. 8 and the ridge laser structure of FIG. 6 lies in the current concentration and collection structure. The ridge structure and current blocking layer of FIG. 6 concentrate current in a central part of the active layer 3 for collection by the contacting layer 8. In the laser embodiment of FIG. 8, the third cladding layer 4b does not have the trapezoidal cross-sectional shape of a ridge or mesa but, rather, extends across the entire width of the laser and projects to the second cladding layer 4a in a groove 13 that penetrates through the current blocking layer 7. The respective layers of the lasers of FIGS. 6 and 8 have approximately the same thicknesses. Like the structure of FIG. 6, different materials can be employed in various embodiments of the structure of FIG. 8. For example, the cladding layers may be $(Al_{0.7}Ga_{0.3})_{0.5}In_{0.5}P$ with an active layer of $Ga_{0.5}In_{0.5}P$. Alternatively, the cladding layers may be $Al_xGa_{1-x}As$ with an active layer of $Al_yGa_{1-y}As$ where $x > y$. Although the laser structure of FIG. 8 does not include an etch stopping layer 90, such a layer could be included.

Figure 9A:
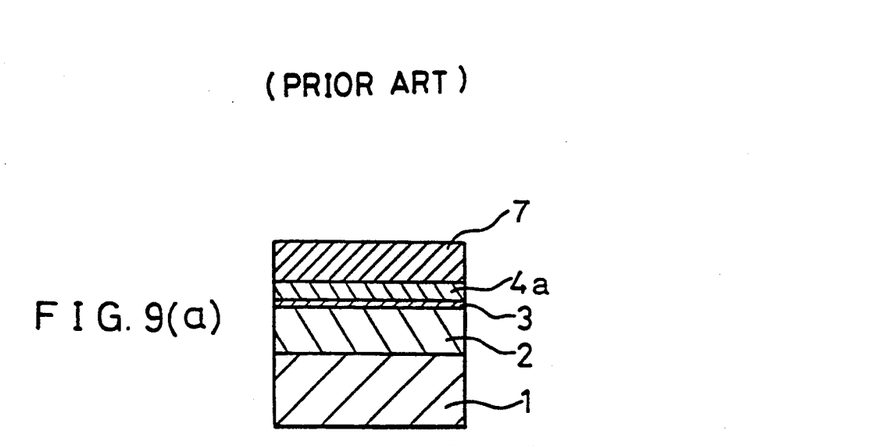
FIGS. 9(a)-9(c) illustrate a method of making the prior art semiconductor laser of FIG. 8.
Figure 9B:
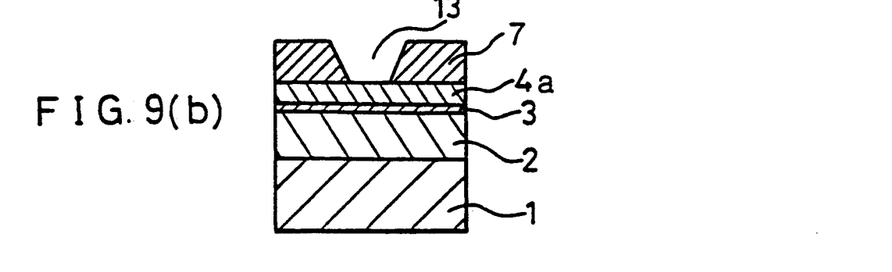
Figure 9C:
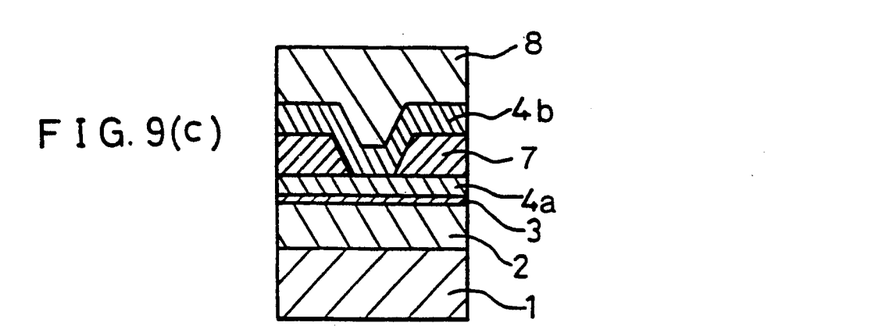

FIGS. 9(a)-9(c) illustrate steps in a method of making the laser structure of FIG. 8. Initially, on the substrate 1, the first cladding layer 2, the active layer 3, the second cladding layer 4a, and the current blocking layer 7 are successively grown. As shown in FIG. 9(b), the current blocking layer 7 is etched, preferably with the aid of a mask that is not shown, to form a stripe groove 13 extending through the current blocking layer 7, exposing a central portion of the second cladding layer 4a, and dividing the current blocking layer 7 into two parts.

Subsequently, as illustrated in FIG. 9(c), the third cladding layer 4b and the contacting layer 8 are successively grown on the current blocking layer 7 and on the exposed portion of the second cladding layer 4a between the two parts of the current blocking layer.

To complete the semiconductor laser, the electrodes 15 and 16 are deposited and the facets 17 and 18 are formed by cleaving.

Figure 10:
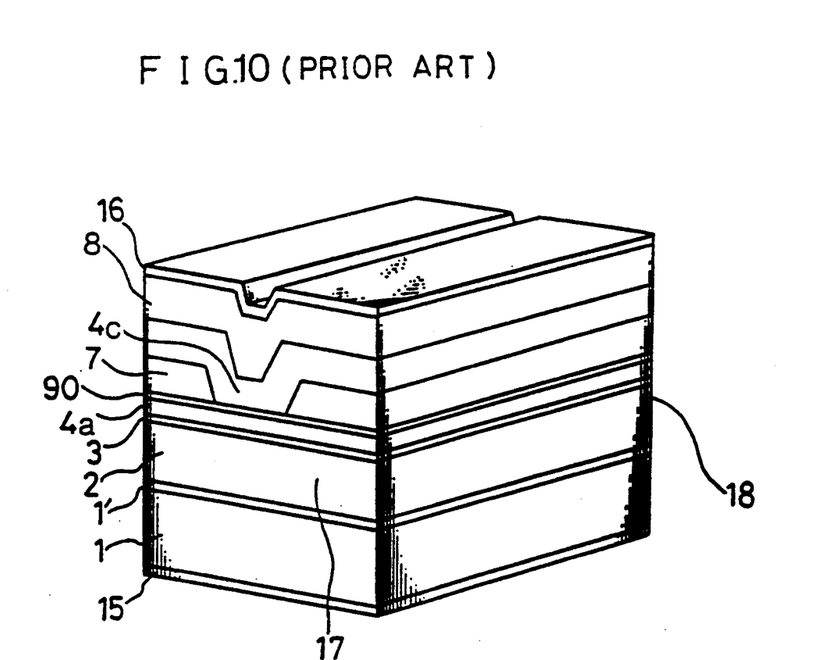
FIG. 10 is a perspective view of a semiconductor laser in accordance with the prior art.
Figures 11A, 11B, 11C:
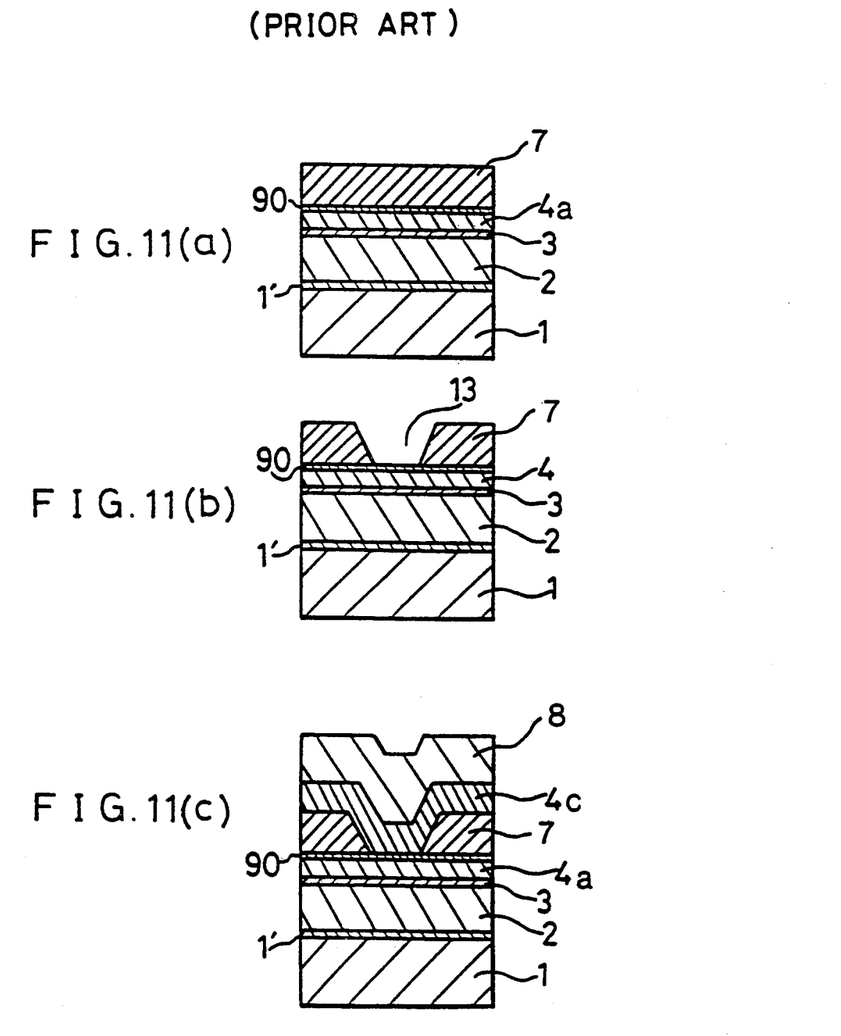
FIGS. 11(a)-11(c) illustrate a method of making the prior art semiconductor laser of FIG. 10.

Another prior art SAS semiconductor laser, disclosed in Japanese Published Patent Application 1134985, is shown in a perspective view in FIG. 10. Steps in a method or producing that laser are illustrated in FIGS. 11(a)-11(c). The laser embodiment described in Japanese Published Patent Application 1-134985 has an n-type $Al_{0.35}Ga_{0.65}As$ cladding layer 2 approximately two microns thick. A buffer layer 1' approximately one micron thick provides a gradual transition between the GaAs substrate 1 and the different material of the cladding layer 2. In this structure, the active layer 3 is GaAs. In place of the third cladding layer 4b having the same composition as the first and second cladding layers 2 and 4a, the laser of FIG. 10 includes a p-type light guide layer 4c of $Al_{0.25}Ga_{0.75}As$, a slightly different composition from the cladding layers 2 and 4a. In addition, like the structure of FIG. 6, the structure of FIG. 10 includes a p-type GaInP etch stopping layer 90 about 100 nm thick disposed between the second cladding layer 4a and the current blocking and light guide layers. Otherwise, the layer thicknesses and elements of the laser of FIG. 10 are identical to those already described.

The manufacturing steps shown in FIGS. 11(a)-11(c) are essentially identical to those shown in FIGS. 9(a)-9(c). The difference lies in the presence and exploitation of the GaInP etch stopping layer 90 which controls the depth of the etching that forms the stripe groove 13. In addition, in the laser of FIG. 10, the groove shape is replicated on the surface of contacting layer 8.

An advantage is achieved in laser structures, such as those of FIGS. 6, 8, and 10, in embodiments that employ cladding layers of aluminum gallium arsenide (AlGaAs) when a GaInP etch stopping layer 90 is included in the structure. The aluminum containing layers are spontaneously oxidized when exposed to the atmosphere or in wet etching, for example, in the step illustrated in FIG. 9(b), when a stripe groove or a ridge is formed by etching. When the etch stopping layer 90 is present, it protects the underlying AlGaAs cladding layer from oxygen during etching or atmospheric exposure. When oxidation is prevented, subsequently grown layers, such as the current blocking layer 7 in a ridge structure or the third cladding layer 4b or light guide layer 4c in an SAS structure, are likely to have better crystallinity and electrical characteristics.

Although the etch stopping layer 90 is effective in preventing oxidation of a regrowth interface, its presence can produce problems. For example, a GaInP etch stopping layer is subject to some thermal decomposition, i.e., deterioration, during the growth of subsequent layers. When the etch stopping layer deteriorates, the layers grown on it are of poor quality. In addition, the resistivity of a GaInP etch stopping layer is about two orders of magnitude lower than that of AlGaInP cladding layers when both the cladding layers and the etch stopping layer contain about the same concentration of dopant impurities. Thus, the etch stopping layer can provide a relatively low resistance path on the surface of the adjacent cladding layer. Because of the presence of the lower resistance layer, some of the current flowing through the laser tends to spread beyond the portion of the active layer where there is a gap in the current blocking layer, either in a ridge or groove structure. In other words, the current flowing in the laser is less efficiently concentrated when a GaInP etch stopping layer is present throughout the full width of the structure, as in the prior art lasers.

SUMMARY OF THE INVENTION

It is an object of the present invention to provide a semiconductor laser including an etch stopping layer across part of the width of the laser, thereby providing good etching control and high quality materials on the regrowth interface without sacrificing current confinement efficiency.

It is another object of the present invention to provide a method of making a semiconductor laser including producing an etch stopping layer providing good etching control, removing part of the etch stopping layer to produce a high quality regrowth interface, and growing a good quality semiconductor layer on the regrowth interface, thereby producing a laser with good current confinement efficiency.

A semiconductor laser according to one aspect of the invention comprises a first conductivity type semiconductor substrate; a first conductivity type semiconductor first cladding layer disposed on the substrate; a semiconductor active layer disposed on the first cladding layer; a second conductivity type semiconductor second cladding layer disposed on the active layer; current concentration and collection means for confining current flow to part of the active layer comprising a second conductivity type ridge structure disposed on the second cladding layer and a first conductivity type semiconductor current blocking layer disposed directly on the second cladding layer and adjacent to and contacting the ridge structure, the ridge structure including a semiconductor etch stopping layer different in composition from and disposed on the second cladding layer and a second conductivity type semiconductor third cladding layer disposed on and different in composition from the etch stopping layer; and first and second electrodes respectively disposed on the substrate and the current concentration and collection means.

Another aspect of a semiconductor laser according to the invention comprises a first conductivity type semiconductor substrate; a first conductivity type semiconductor first cladding layer disposed on the substrate; a semiconductor active layer disposed on the first cladding layer; a second conductivity type semiconductor second cladding layer disposed on the active layer; current concentration and collection means for confining current flow to part of the active layer comprising a groove structure disposed on the second cladding layer including a first conductivity type semiconductor current blocking layer having a groove extending to the second cladding layer, a semiconductor etch stopping layer disposed between, in contact with, and different in composition from the current blocking layer and the second cladding layer, and a second conductivity type semiconductor third cladding layer disposed on the current blocking layer and on and in direct contact with the second cladding layer in the groove in the current blocking layer; and first and second electrodes respectively disposed on the substrate and the current concentration and collection means.

A semiconductor laser according to the invention comprises a first conductivity type semiconductor substrate; a first conductivity type semiconductor first cladding layer disposed on the substrate; a semiconductor active layer disposed on the first cladding layer; a first electrode disposed on the substrate; and current concentration and collection means for confining current flow to part of the active layer; and a second electrode disposed on the current concentration and collection means wherein the current concentration and collection means includes a regrowth interface on part of the second cladding layer, a semiconductor etch stopping layer disposed on part of and different in composition from the second cladding layer, but not disposed on the regrowth interface part of the second cladding layer, a second conductivity type semiconductor third cladding layer in electrical communication with the second cladding layer, and a first conductivity type semiconductor current blocking layer in contact with the third cladding layer for blocking the flow of current between the first and second electrodes except through the part of the active layer.

A method of making a semiconductor laser according to the invention comprises successively growing on a first conductivity type semiconductor substrate a first conductivity type semiconductor cladding layer, a semiconductor active layer, a second conductivity type semiconductor second cladding layer, a semiconductor etch stopping layer, and a second conductivity type semiconductor third cladding layer different in composition from the etch stopping layer; masking a portion of the third cladding layer and etching the third cladding layer to produce a mesa and expose part of the etch stopping layer, the etch stopping layer preventing etching of the second cladding layer; removing the exposed part of the etch stopping layer, thereby exposing part of the second cladding layer; growing a first conductivity type semiconductor current blocking layer on the second cladding layer adjacent to and in contact with the mesa; growing a second conductivity type semiconductor contacting layer on the current blocking layer and the mesa; forming first and second electrodes on the substrate and contacting layer, respectively; and forming opposed facets transverse to the mesa.

Another method of making a semiconductor laser according to the invention comprises successively growing on a first conductivity type semiconductor substrate a first conductivity type semiconductor cladding layer, a semiconductor active layer, a second conductivity type semiconductor second cladding layer, a semiconductor etch stopping layer, and a first conductivity type semiconductor current blocking layer different in composition from the etch stopping layer; etching a groove through the current blocking layer, thereby exposing part of the etch stopping layer, the etch stopping layer preventing exposure of the second cladding layer; removing the exposed part of the etch stopping layer, thereby exposing part of the second cladding layer; successively growing on the exposed part of the second cladding layer and on the current blocking layer a second conductivity type semiconductor third cladding layer and a second conductivity type semiconductor contacting layer; forming first and second electrodes on the substrate and contacting layer, respectively; and forming opposed facets transverse to the groove.

Other objects and advantages of the present invention will become apparent from the detailed description that follows The detailed description and specific embodiments are provided for illustration only, since various additions and modifications within the spirit and scope of the invention will be apparent to those of skill in the art.

DETAILED DESCRIPTION OF PREFERRED EMBODIMENTS

Figure 1:
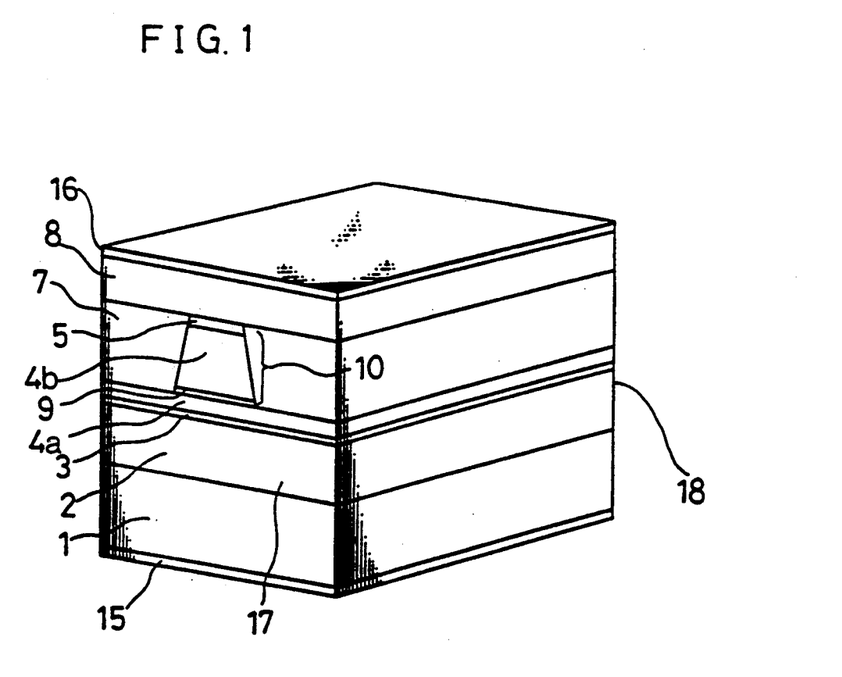
FIG. 1 is a perspective view of a semiconductor laser in accordance with an embodiment of the invention.

FIG. 1 is a perspective view of a semiconductor laser according to an embodiment of the invention. The structure shown in FIG. 1 is identical to the structure shown in FIG. 6 except that the GaInP etch stopping layer 90 of FIG. 6, which extends across the entire width of the facets 17 and 18, is replaced by a GaInP etch stopping layer 9 that is confined to and within the ridge structure 10 in its lateral extent across the facets 17 and 18. In the semiconductor laser of FIG. 1, the structure for confining and collecting the current includes the contacting layer 8, the ridge structure 10, and the current blocking layer 7 disposed on opposite sides of the ridge structure between the contacting layer 8 and the second cladding layer 4a. The ridge structure 10 includes the etch stopping layer 9, the third cladding layer 4b, and the transition layer 5. Since the etch stopping layer 9 is confined to the ridge structure 10, it neither interferes with nor adversely affects the current confinement achieved by the pn junction formed between the current blocking layer 7 and the second cladding layer 4a.

Structures in accordance with the embodiment of FIG. 1 may be made with various semiconductor materials. For example, the cladding layers 2, 4a, and 4b may be $(Al_{0.7}Ga_{0.3})_{0.5}In_{0.5}P$ with an active layer 3 and an etch stopping layer 9 of $Ga_{0.5}In_{0.5}P$. These layers are used in combination with a GaAs substrate 1, a GaAs transition layer 5, a GaAs current blocking layer 7, and a GaAs contacting layer 8. Alternatively, the cladding layers 2 4a and 4b may be $Al_{0.45}Ga_{0.55}As$ with an active layer 3 of $Al_{0.07}Ga_{0.93}As$ and an etch stopping layer 9 of $Ga_{0.5}In_{0.5}P$. These layers are used in combination with the GaAs substrate 1, the GaAs transition layer 5, the GaAs current blocking layer 7, and the GaAs contacting layer 8.

A method of making a semiconductor laser having the structure of FIG. 1 is illustrated in the steps shown in FIGS. 2(a)–2(e). The conditions, i.e., temperature and pressure, in some of the steps illustrated are different depending upon the particular materials employed in the cladding and active layers. Accordingly, FIGS. 2(a)–2(e) are initially described with respect to a structure including AlGaInP cladding layers and subsequently with regard to a structure including AlGaAs cladding layers.

Figure 2A:
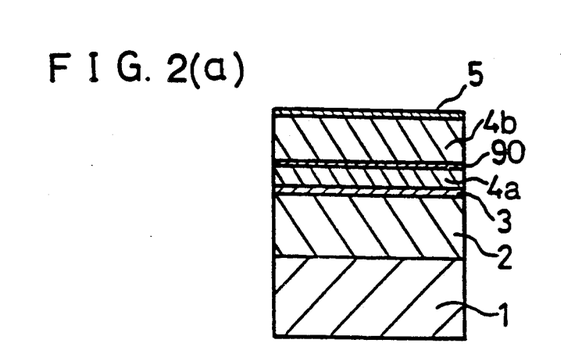
FIGS. 2(a)-2(e) illustrate a method of making the semiconductor laser embodiment of FIG. 1.

In one embodiment of the invention, an n-type $(Al_{0.7}Ga_{0.3})_{0.5}In_{0.5}P$ first cladding layer 2 approximately one micron thick, a $Ga_{0.5}In_{0.5}P$ active layer 3 approximately 0.1 micron thick, a p-type $(Al_{0.7}Ga_{0.3})_{0.5}In_{0.5}P$ second cladding layer 4a approximately 0.3 micron thick, a p-type $Ga_{0.5}In_{0.5}P$ etch stopping layer 90 four to ten nm thick, a p-type $(Al_{0.7}Ga_{0.3})_{0.5}In_{0.5}P$ third cladding layer 4b approximately 0.7 micron thick, and a p-type GaAs transition layer 5 approximately 0.2 micron thick are successively epitaxially grown on a GaAs substrate 1, preferably by MOCVD, all as illustrated in FIG. 2(a). All of the layers, including the initial etch stopping layer 90, have the same width, the full width of the substrate 1.

Figure 2B:
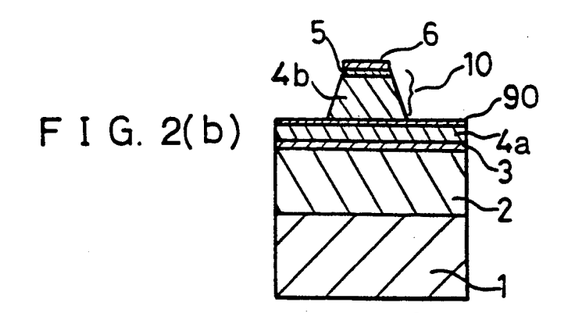

The step illustrated in FIG. 2(b) is identical to that already described with respect to FIG. 7(b) and does not need detailed repetition. In forming the ridge structure 10, an etchant that etches the AsGaInP third cladding layer 4b but does not etch the GaInP etch stopping layer 90, such as sulfuric acid, is used, thus accurately controlling the height of the ridge structure 10, i.e., mesa, without reducing the thickness of the second cladding layer 4a.

Figure 2C:
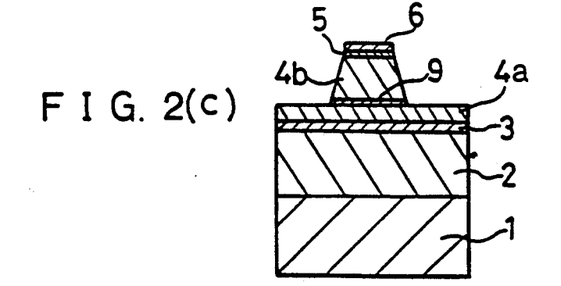

In the step illustrated in FIG. 2(c), the portions of the full width etch stopping layer 90 lying beyond the ridge structure 10 are removed. The portion of the etch stopping layer 90 lying within the ridge structure, i.e., the etch stopping layer 9, remains. The second cladding layer 4a is not damaged in the partial removal of the etch stopping layer 90. In general, when the incomplete structure is held at an elevated temperature in an epitaxial growth apparatus, for example, between the growth of various layers, an excess pressure of phosphorus is employed to avoid thermal decomposition of III-V compound semiconductor materials containing phosphorus, such as AlGaInP or GaInP. However, the inventors have learned that the rate of the thermal decomposition of GaInP and AlGaInP for the same excess pressure of phosphorus, usually provided by phosphine (PH₃), are significantly different at various temperatures. For example, when the pressure within the epitaxial growth apparatus is about 76 Torr with a flow rate of ten percent PH₃ of 300 standard cubic centimeters per minute, GaInP begins to thermally decompose at temperatures in excess of 600° C. and is completely decomposed at 740° C. By contrast, $(Al_{0.7}Ga_{0.3})_{0.5}In_{0.5}P$ does not decompose in the presence of an excess phosphorus pressure even at a temperature of 740° C. Thus, if the structure shown in FIG. 2(b) including the etch stopping layer 90 of four to ten nm thick is held under the specified conditions in a phosphorus ambient at 740° C. for twenty minutes, the parts of the etch stopping layer 90 not protected by the ridge structure 10 are thermally decomposed and removed, leaving the etch stopping layer 9. Even though the etch stopping layer 90 is very thin, if its temperature is raised to no more than about 700° C. for a relatively long time, only slight decomposition occurs which roughens the surface without completely removing any part of the layer 90. The rough surface interferes with the subsequent growth of the current blocking layer 7. On the other hand, when the temperature is increased to 740° C. for twenty minutes under the specified conditions, the etch stopping layer 90 is completely removed where not protected by the ridge structure 10, possibly because the higher temperature drives off the metallic Ga and In that can coalesce from the decomposing etch stopping layer.

After removal of the portions of the etch stopping layer 90 lying beyond the ridge structure 10, leaving the etch stopping layer 9 in place, some surfaces of the second cladding layer 4a are exposed. However, those surfaces are not exposed to the atmosphere but only to the ambient within the epitaxial growth apparatus. Therefore, those exposed surfaces do not become oxidized and no oxide layer is present to interfere with the subsequent growth of the current blocking layer 7, a step illustrated in FIG. 2(d). In other words, according to the invention, the etch stopping layer 90 is employed to control the depth of etching in forming the ridge structure 10 and to protect the underlying second cladding layer 4a from oxidation during etching of the ridge structure 10. In addition, by removal of portions of the etch stopping layer 90 lying outside the ridge structure 10, i.e., at the regrowth interface, without exposing any of the cladding layer 4a to the atmosphere, the etch stopping layer 9 is not present between the current blocking layer 7 and the second cladding layer 4a to adversely affect the performance of the current confining and collection means nor to interfere with the growth of a high quality current blocking layer 7 at the regrowth interface on the second cladding layer 4a.

Figure 2D:
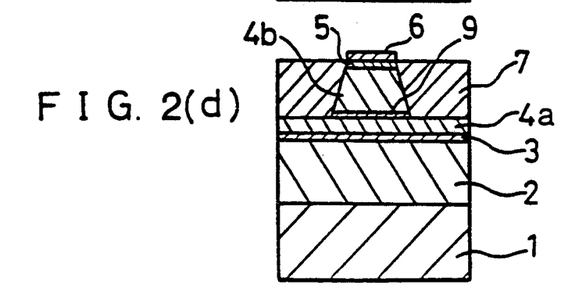
Figure 2E:
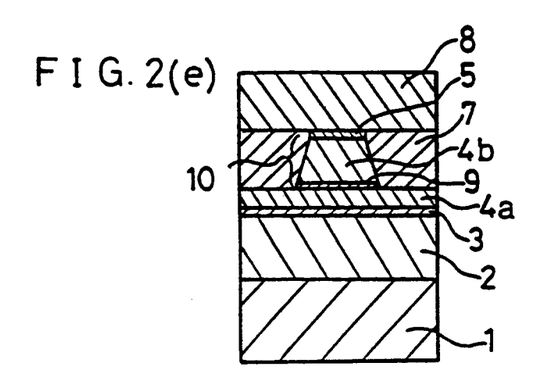
Figure 7D:
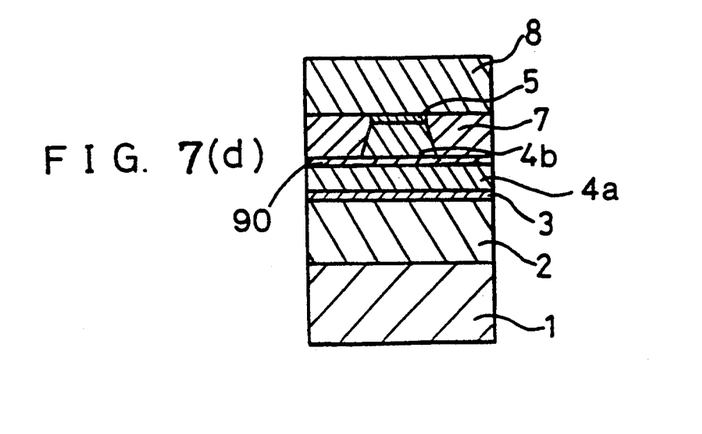

The steps illustrated in FIGS. 2(d) and 2(e) are identical to those already described with respect to FIGS. 7(c) and 7(d) and, therefore, do not require repeated description.

In an alternative embodiment of a laser employing a ridge structure according to the invention, an n-type $Al_{0.45}Ga_{0.55}As$ cladding layer 2 approximately one micron thick, an $Al_{0.7}Ga_{0.93}As$ active layer 3 approximately 0.1 micron thick, a p-type $Al_{0.45}Ga_{0.55}As$ second cladding layer 4b 0.2 micron to 0.3 micron thick, a p-type $Ga_{0.5}In_{0.5}P$ etch stopping layer 90 one to ten nm thick, a p-type $Al_{0.45}Ga_{0.55}As$ third cladding layer 0.7 to 0.8 micron thick, and a p-type GaAs transition layer 5 approximately 0.2 micron thick are successively epitaxially grown on an n-type GaAs substrate 1, preferably with a (100) surface orientation, preferably by MOCVD.

Trimethylgallium, trimethylaluminum, and arsine (AsH$_3$) are used as source gases for growing the various layers. The appropriate source gases, depending upon the composition of the layer being grown, are introduced into an epitaxial growth apparatus and layers are grown at a temperature of 650° C. to 700° C. at a pressure of about 76 Torr. The growth temperature has been experimentally determined. In those experiments, it was found impossible to grow GaInP directly on AlGaAs or GaAs at a temperature of 750° C. or more. Thus, during the successive growth of layers in this embodiment, as illustrated in FIG. 2(a), careful attention must be given to the temperature at which each layer is grown. For example, after growing the first cladding layer 2, the active layer 3, and the second cladding 4a at a temperature of 750° C. to 800° C., the temperature is decreased to about 650° C. to 700° C. in order to grow the GaInP etch stopping layer 90, the third cladding layer 4b, and the transition layer 5.

The step of forming the ridge structure 10 in FIG. 2(b), preferably along the <$\overline{011}$> direction, is carried out preferably with a sulfate etchant, such as sulfuric acid, which does not attack the etch stopping layer 90. As in all examples, the width w of the ridge is about three to five microns.

Since, in the embodiment being described, the layers are Al$_{0.45}$Ga$_{0.55}$As, an excess pressure of arsenic is present in the growth apparatus when layers are not being grown to avoid thermal decomposition of the previously grown layers and substrate. The excess arsenic pressure, usually provided by AsH$_3$, is also present while the unprotected portions of the etch stopping layer 90 are thermally decomposed. (When the Group V constituent of the cladding layer is phosphorus, an excess pressure of phosphorus is provided in the epitaxial growth apparatus. That phosphorus ambient may retard the thermal decomposition of the GaInP etch stopping layer, as compared to the decomposition rate in an arsenic ambient, since the etch stopping layer also includes phosphorus as the Group V element.) In the arsenic ambient, the exposed portions of the etch stopping layer 90 are decomposed at a temperature of about 700° C. to 750° C., producing the structure of FIG. 2(c) in which the etch stopping layer 9 remains between the ridge structure 10 and the second cladding layer 4a. The remaining etch stopping layer 9 is protected from thermal decomposition by the ridge structure.

The remainder of the processing illustrated in FIGS. 2(c)-2(e) is identical to that already described with respect to the first embodiment of the method described and/or with respect to the prior art and, therefore, repeated description is not necessary. The same advantages are achieved in both embodiments of the invention, namely, protection of the underlying second cladding layer 4a from oxidation during wet etching in forming the ridge structure 10 and removal of the unprotected portions of the etch stopping layer 90 without oxidation of the underlying second cladding layer, i.e., at the regrowth interface, that could interfere with the growth when the current blocking layer 7 is grown.

Figure 3:
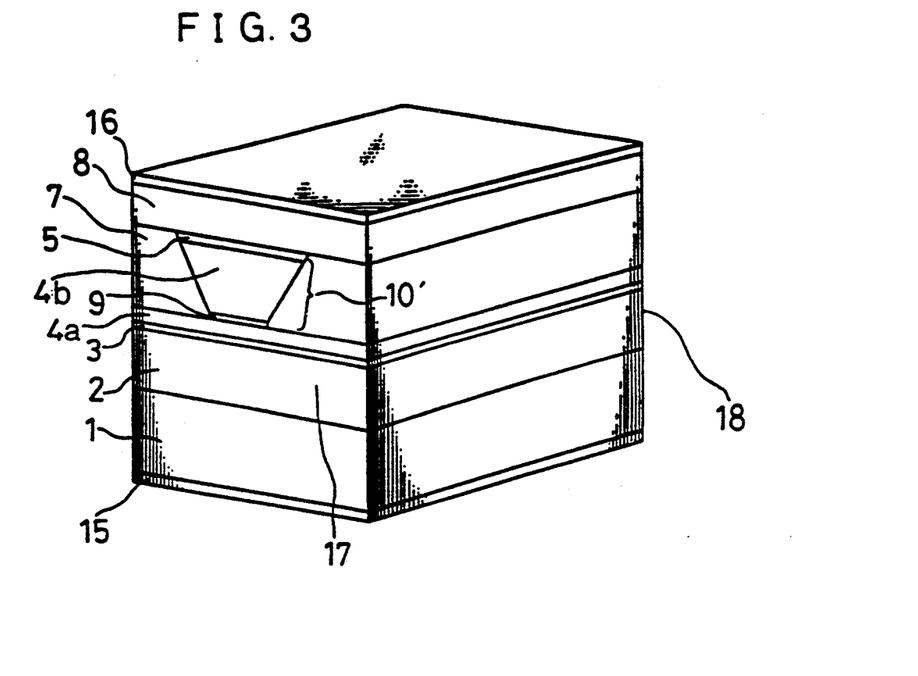
FIG. 3 is a perspective view of a semiconductor laser in accordance with an embodiment of the invention.

As well known in the art, the forward mesa ridge structure 10 of FIG. 1, i.e., the trapezoidal cross-section of the third cladding layer 4b in a plane generally parallel to the facets 17 and 18 with sides diverging toward the active layer 3, can be alternatively formed as a reverse mesa ridge 10' as shown in FIG. 3. In the reverse mesa 10', the sides of the trapezoid converge in the direction of the active layer 3. The reversal of the mesa type is accomplished by changing the orientation of the etching mask 6 relative to the crystallographic orientation of the substrate 1.

Figure 4:
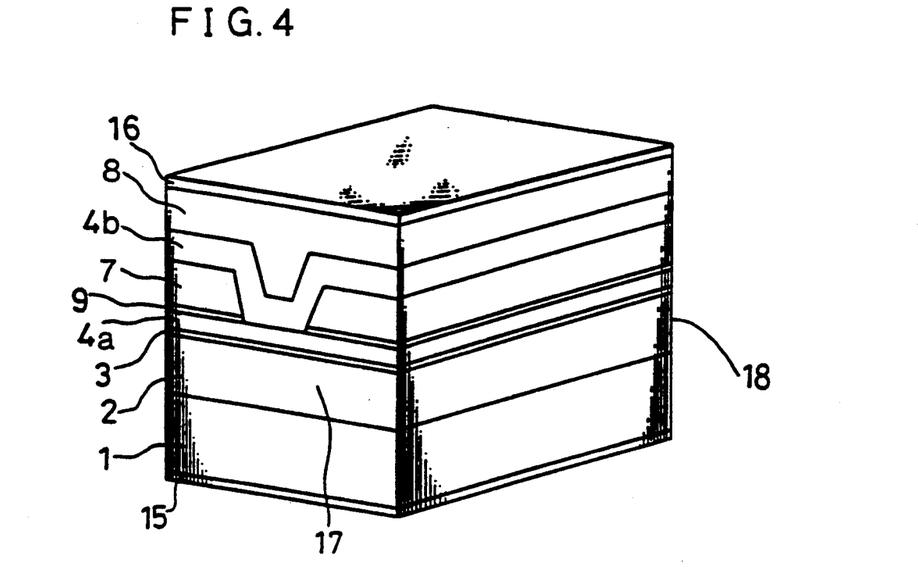
FIG. 4 is a perspective view of a semiconductor laser in accordance with an embodiment of the invention.

FIG. 4 is a perspective view of an embodiment of an SAS laser according to the invention. The structure of FIG. 4 is nearly identical to the laser structures of FIGS. 8 and 10. An important improvement in the structure of FIG. 4 is the presence of the etch stopping layer 9 only between the current blocking layer 7 and the second cladding layer 4a. No etch stopping layer is present between the directly contacting portions of the second and third cladding layers 4a and 4b, i.e., at the regrowth interface where the third cladding layer is grown directly on the second cladding layer.

Steps in a process of making the semiconductor laser structure of FIG. 4 are illustrated in FIGS. 5(a)-5(d). The invention is not limited to particular semiconductor materials providing the etch stopping layer 9 is different in composition from the adjacent layer that it etched and is a semiconductor material, like GaInP, that can be completely removed, when unprotected, in a process, such as by thermal decomposition, that does not result in oxidation of or damage to the underlying second cladding layer. Accordingly, the steps illustrated in FIGS. 5(a)-5(d) are described separately with respect to two exemplary embodiments employing different semiconductor materials.

Figure 5A:
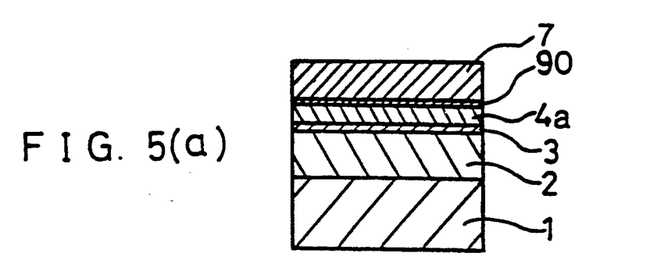
FIGS. 5(a)-5(d) illustrate a method of making the semiconductor laser embodiment of FIG. 4.

In one embodiment, the step represented in FIG. 5(a) illustrates the successive growth of an n-type (Al$_{0.7}$Ga$_{0.3}$)$_{0.5}$In$_{0.5}$P first cladding layer 2 approximately one micron thick, a Ga$_{0.5}$In$_{0.5}$P active layer 3 approximately 0.1 micron thick, a p-type (Al$_{0.7}$Ga$_{0.3}$)$_{0.5}$In$_{0.5}$P second cladding layer 4a approximately 0.3 micron thick, a p-type Ga$_{0.5}$In$_{0.5}$P etch stopping layer 90 approximately four to ten nm thick, and an n-type GaAs current blocking 7 approximately one micron thick on a GaAs substrate 1, preferably by MOCVD.

Figure 5B:
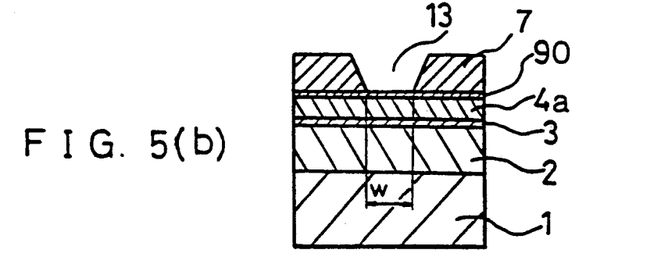

In the step illustrated in FIG. 5(b), the current blocking layer 7 is selectively etched to form a stripe groove 13 extending through the current blocking layer 7 and exposing a central portion of the etch stopping layer 90 having a width w of approximately three to five microns.

Subsequently, the exposed portion of the etch stopping layer 90 is thermally decomposed and removed in an epitaxial growth apparatus according to the process previously described with respect to FIG. 2(c). An excess phosphorus pressure is established in the apparatus at a subatmospheric pressure, for example, 76 Torr, and the temperature of the structure is raised to about 740° C. so that the exposed portion of the etch stopping layer 90 is thermally decomposed and completely removed in the groove 13 between the remaining portions of the current blocking layer 7. The remaining portions of the etch stopping layer 90, namely, etch stopping layer 9, disposed beneath the remaining portions of the current blocking layer 7 are prevented from decomposing by the current blocking layer 7 and remain in place. The second cladding layer 4a is not oxidized when it is exposed during the thermal decomposition of part of the etch stopping layer 90 because the ambient within the reaction apparatus where the decomposition takes place is relatively free of oxygen. Accordingly, when the third cladding layer 4b is grown on the exposed portion of the second cladding layer 4a, i.e., the regrowth interface, no oxide is present at the regrowth interface to interfere with the crystalline quality of the third cladding layer.

Figure 5C:
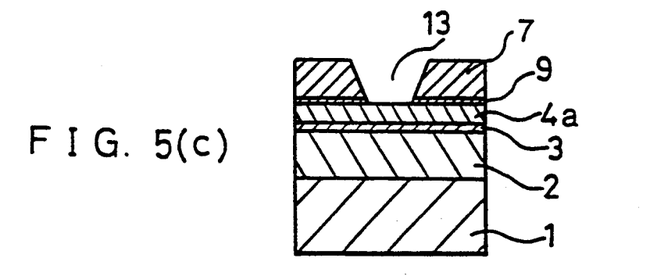
Figure 5D:
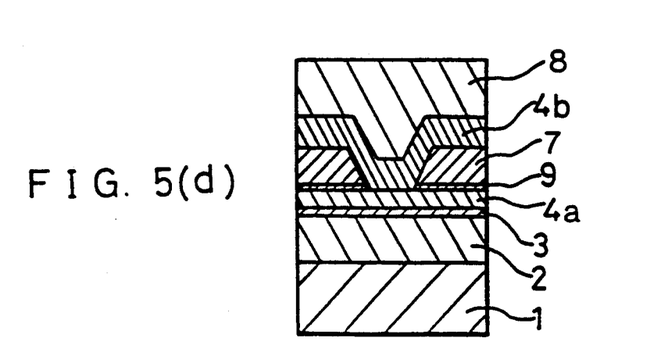

In the final growth step, illustrated in FIG. 5(d), the third cladding layer 4b is grown on the exposed portion of the second cladding layer 4a, i.e., the regrowth interface, and on the remaining portions of the current blocking layer 7 in the same epitaxial growth apparatus where the portion of the etch stopping layer 90 was thermally decomposed and, most preferably, immediately following that thermal decomposition. The third cladding layer 4b is $(Al_{0.7}Ga_{0.3})_{0.5}In_{0.5}P$ approximately 0.7 micron thick. The p-type GaAs contacting layer 8 is subsequently grown to a thickness of about three microns. The production of the laser structure is completed by forming electrodes 15 and 16 on the substrate 1 and the contacting layer 8, respectively, and cleaving to produce facets 17 and 18.

Very similar processing steps are carried out when different materials are employed in a method of making the laser structure of FIG. 4 according to the invention. In an alternative embodiment, the step represented in FIG. 5(a) includes successive deposition of an n-type $Al_{0.45}Ga_{0.55}As$ first cladding 2 approximately one micron thick, an $Al_{0.07}Ga_{0.93}As$ active layer 3 approximately 0.1 micron thick, a p-type $Al_{0.45}Ga_{0.55}As$ second cladding layer 4a 0.2 to 0.3 micron thick, a p-type GaInP etch stopping layer 90 one to ten nm thick, and an n-type GaAs current blocking layer 7 approximately one micron thick on an n-type GaAs substrate 1, preferably by MOCVD.

As in the process previously described with respect to FIG. 5(b), a portion of the current blocking layer 7 is removed, for example, by wet etching, to produce a stripe groove 13 extending to and exposing a portion of the etch stopping layer 90. The width w of the stripe groove may be approximately three to five microns. The exposed portion of the etch stopping layer 90 is thermally decomposed in a reduced pressure arsenic ambient. Because the etch stopping layer 90 is thinner in this embodiment than in the previously described embodiment employing different cladding layer materials and because of the absence of an excess pressure of phosphorus, the exposed portion of the etch stopping layer 90 is quickly decomposed at a temperature of 700° C. to 750° C. The resulting structure is shown in FIG. 5(c).

The step illustrated in FIG. 5(d) is identical to that of the previously described embodiment employing different materials except that the third cladding layer 4b grown in the step is $Al_{0.45}Ga_{0.55}As$. Likewise, the structure is completed by forming the electrodes 15 and 16 and cleaving to produce the facets 17 and 18.

As in other embodiments of the invention, the thermal decomposition of a portion of the etch stopping layer 90 within the material growth apparatus prevents the oxidation of the exposed portion of the second cladding layer 4a, the regrowth interface, so that a high quality third cladding layer 4b can be grown.

Although the method of producing embodiments of the invention have been described as preferably employing MOCVD, other epitaxial growth techniques may be employed in making the invention. For example, one or more of the layers of the laser structures may be deposited by molecular beam epitaxy. The specific examples described employ particular conductivity types in the substrate, cladding, current blocking, and contacting layers. However, the conductivity types of the substrate and those layers can be reversed from those of the specific embodiments described.

We claim:

1. A semiconductor laser comprising:
   a first conductivity type semiconductor substrate;
   a first conductivity type semiconductor first cladding layer disposed on the substrate;
   a semiconductor active layer disposed on the first cladding layer;
   a second conductivity type semiconductor second cladding layer disposed on the active layer;
   current concentration and collection means for confining current flow to part of the active layer comprising a second conductivity type ridge structure disposed on the second cladding layer and a first conductivity type semiconductor current blocking layer disposed directly on the second cladding layer and adjacent to and contacting the ridge structure, the ridge structure including a semiconductor etch stopping layer different in composition from and disposed on the second cladding layer, a second conductivity type semiconductor third cladding layer disposed on and different in composition from the etch stopping layer, and a second conductivity type semiconductor transition layer disposed on the third cladding layer;
   a second conductivity type semiconductor contacting layer disposed on and contacting the current concentration and collection means; and
   first and second electrodes respectively disposed on the substrate and the contacting layer.

2. The semiconductor laser of claim 1 wherein the first, second, and third cladding layers are AlGaInP and the active and etch stopping layers are GaInP.

3. The semiconductor laser of claim 2 wherein the etch stopping layer has a thickness between the second and third cladding layers of four to ten nanometers.

4. The semiconductor laser of claim 1 wherein the first, second, and third cladding layers are $Al_xGa_{1-x}As$, the active layer is $Al_yGa_{1-y}As$, where $x>y$, and the etch stopping layer is GaInP.

5. The semiconductor laser of claim 4 wherein the etch stopping layer has a thickness between the second and third cladding layers of one to ten nanometers.

6. A semiconductor laser comprising:
   a first conductivity type semiconductor substrate;
   a first conductivity type semiconductor first cladding layer disposed on the substrate;
   a semiconductor active layer disposed on the first cladding layer;
   a second conductivity type semiconductor second cladding layer disposed on the active layer;
   current concentration and collection means for confining current flow to part of the active layer comprising a groove structure disposed on the second cladding layer including a first conductivity type semiconductor current blocking layer having a groove extending to the second cladding layer, a semiconductor etch stopping layer disposed between, in contact with, and different in composition from the current blocking layer and the second cladding layer, and a second conductivity type semiconductor third cladding layer disposed on the current blocking layer and on and in direct contact with the second cladding layer in the groove in the current blocking layer; and first and second electrodes respectively disposed on the substrate and the current concentration and collection means.

7. The semiconductor laser of claim 6 including a second conductivity type semiconductor contacting layer disposed between and contacting the second electrode and the current concentration and collection means.

8. The semiconductor laser of claim 6 wherein the first, second, and third cladding layers are AlGaInP and the active and etch stopping layers are GaInP.

9. The semiconductor laser of claim 8 wherein the etch stopping layer has a thickness between the second and third cladding layers of four to ten nanometers.

10. The semiconductor laser of claim 6 wherein the first, second, and third cladding layers are $Al_xGa_{1-x}As$, the active layer is $Al_yGa_{1-y}As$, where $x>y$, and the etch stopping layer is GaInP.

11. The semiconductor laser of claim 10 wherein in the etch stopping layer has a thickness between the second and third cladding layers of one to ten nanometers.

* * * * *